(12) United States Patent
Kim

(10) Patent No.: US 7,447,040 B2
(45) Date of Patent: Nov. 4, 2008

(54) FLEXIBLE PRINTED CIRCUIT BOARD FOR ELECTRONIC EQUIPMENT

(75) Inventor: Sang-Bo Kim, Gumi-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/344,123

(22) Filed: Feb. 1, 2006

(65) Prior Publication Data

US 2006/0285302 A1    Dec. 21, 2006

(30) Foreign Application Priority Data

Jun. 7, 2005    (KR) ...................... 10-2005-0048281

(51) Int. Cl.
*H05K 1/00*    (2006.01)

(52) U.S. Cl. ................ 361/749; 361/750; 174/254

(58) Field of Classification Search ......... 361/749–750, 361/748, 679, 600, 822, 789; 439/43, 55, 439/67, 62, 65, 77, 59; 174/254–255
See application file for complete search history.

(56) References Cited

U.S. PATENT DOCUMENTS

| | | | | |
|---|---|---|---|---|
| 5,127,570 A | * | 7/1992 | Steitz et al. ................. 228/103 |
| 5,168,430 A | * | 12/1992 | Nitsch et al. ................ 361/749 |
| 5,224,023 A | * | 6/1993 | Smith et al. ................. 361/784 |
| 5,266,746 A | * | 11/1993 | Nishihara et al. ............ 174/254 |
| 5,461,202 A | * | 10/1995 | Sera et al. .................... 174/254 |
| 5,667,410 A | * | 9/1997 | Johnston ...................... 439/700 |
| 5,717,556 A | * | 2/1998 | Yanagida ...................... 361/803 |
| 6,193,544 B1 | * | 2/2001 | McGinnis ..................... 439/492 |
| 6,332,799 B1 | * | 12/2001 | Torii et al. ................... 439/352 |
| 6,434,014 B1 | * | 8/2002 | Gerdom et al. ............. 361/752 |
| 6,447,314 B1 | * | 9/2002 | Kato et al. ................... 439/165 |
| 6,682,364 B2 | * | 1/2004 | Cisey .......................... 439/441 |
| 6,777,621 B2 | * | 8/2004 | Ishikawa et al. ............. 174/260 |
| 6,781,230 B2 | * | 8/2004 | Tsukamoto .................. 257/700 |
| 2006/0116005 A1 | * | 6/2006 | Yu et al. ....................... 439/67 |

FOREIGN PATENT DOCUMENTS

| | | |
|---|---|---|
| JP | 06-152077 | 5/1994 |
| JP | 2000-294886 | 10/2000 |

* cited by examiner

*Primary Examiner*—Tuan T Dinh
(74) *Attorney, Agent, or Firm*—Roylance, Abrams, Berdo & Goodman, L.L.P.

(57) ABSTRACT

Provided is a flexible printed circuit board (FPCB) including a circuit connector connected to a circuit board connector of a printed circuit board (PCB) for electronic equipment. A first compression part and a second compression part are included in the circuit connector, and a folding part is provided at a first plating interface between the first compression part and the second compression part such that a second plating interface, instead of a first plating interface of the first compression part and the second compression part, is folded by a force generated when the circuit connector is connected to the circuit board connector.

4 Claims, 6 Drawing Sheets

FLEXIBLE PRINTED CIRCUIT BOARD FOR ELECTRONIC EQUIPMENT

PRIORITY

This application claims the benefit under 35 U.S.C. § 119(a) of a Korean Patent Application entitled "Flexible Printed Circuit Board for Electronic Equipment" filed in the Korean Intellectual Property Office on Jun. 7, 2005 and assigned Serial No. 2005-48281, the entire contents of which are hereby incorporated by reference.

BACKGROUND OF THE INVENTION

1. Field of the Invention

The present invention generally relates to a flexible printed circuit board for electronic equipment. In particular, the present invention relates to a flexible printed circuit board for electronic equipment, in which a folding part is folded by a force generated when a connector included in the flexible printed circuit board is engaged.

2. Description of the Related Art

In general, the term "portable communication apparatus" means an electronic apparatus which a user can carry with him/her to perform wireless communication with another party. As examples of the portable communication apparatus, there are hand held phones (HHP), Codeless Telephone (CT)-2 cellular phones, digital phones, personal communication service (PCS) phones, and personal digital assistants (PDAs). Conventional portable communication apparatuses may comprise various types according to their appearance. For example, wireless terminals comprise bar-type wireless terminals, flip-type wireless terminals, and folder-type wireless terminals according to their appearance. The bar-type wireless terminal has a single housing shaped like a bar. The flip-type wireless terminal has a flip or a cover which is pivotally mounted to a bar-shaped housing by a hinge part. The folder-type wireless terminal has a folder coupled to a single bar-shaped housing by a hinge part in such a manner that the folder can be rotated in order to be folded to or unfolded from the housing.

Further, wireless terminals may comprise rotation-type wireless terminals and sliding-type wireless terminals depending on the particular manner the wireless terminal is opened. In the rotation-type wireless terminal, two housings are coupled to each other to allow one housing to rotate open or closed with respect to the other while facing each other. In the sliding-type wireless terminal, two housings are coupled to each other to allow one housing to slide open or closed with respect to the other. These variously classified portable wireless terminals can be easily understood by those skilled in the art. The conventional portable terminals comprise antenna devices, data input/output devices, and data transmission/reception devices. As the data input/output devices, keypads allowing data input through a finger press task are generally used, or touch pads or touch screens may be used.

Liquid crystal displays (LCD) are generally used to display data output from data output devices. For video telephony, conventional portable communication apparatuses are equipped with camera lenses as photographing means which enable users to perform video telephony with others or photograph desired objects.

A sliding-type wireless terminal 10 among various types of wireless terminals will be described with reference to FIG. 1.

In the sliding-type wireless terminal 10, a sliding housing 30 slides a predetermined length along the length of the sliding-type wireless terminal 10 on a main body housing 20 and is opened. The sliding-type wireless terminal 10 has an advantage of adapting to users' various tastes over conventional folder-type terminals.

As illustrated in FIG. 1, the sliding-type wireless terminal 10 comprises the main body housing 20, the sliding housing 30 that slides downward or upward ½ of the length of the main body housing 20 on the main body housing 20, a sliding keypad 31, an LCD 32 for a display function, and a speaker device 33 on the front surface of the sliding housing 30, and a 3×4 main body keypad 21 and a microphone device 22 on the front surface of the main body housing 20.

As illustrated in FIGS. 2 through 6, in the sliding-type wireless terminal 10, a printed circuit board (PCB) 24 is accommodated in the main body housing 20, and a LCD PCB 34 is mounted in the sliding housing 30.

With respect to FIG. 9, a flexible printed circuit board (FPCB) 40 is depicted wherein a micro circuit is printed on a thin board made of flexible plastic as described in more detail below. The FPCB 40 and a circuit board connector 50 printed on each of the PCBs 24 and 34 are used as electric connection means for connecting the PCB 24 and the LCD PCB 34.

The FPCB 40 is a cable that connects the PCB 24 and the LCD PCB 34 to enable components to exchange power sources and signals. The FPCB 40 is usually used when one of two components may be moved or the two components cannot be directly connected.

As illustrated in FIG. 5, the circuit connector 41 connected to the circuit board connector 50 included in the PCB 24 and the LCD PCB 34 is provided at both ends of the FPCB 40. The circuit connector 41 is connected to the circuit board connector 50, which enables signal transmission.

As illustrated in FIGS. 2 and 5, a plurality of points (not shown) for electric connection are provided in the circuit board connector 50 and is engaged with corresponding contact points 40e in FIG. 5 on a portion of the FPCB 40 that extends from the circuit connector 41 of the FPCB 40. At this time, an opening 51 into which the circuit connector 41 can be inserted is formed in the circuit board connector 50 and the opening 51 has a cover 52 for preventing foreign substances from being introduced.

As illustrated in FIG. 4, a cross-section of the circuit connector 41 of the FPCB 40 shows a base film 40a, a circuit pattern 40b on the base film 40a, and a protection film 40d adhered onto the circuit pattern 40b by an adhesive 40c which constitute the flexible plastic board on the FPCB 40, and a compression part 60 either side thereof.

A compression part 60 whose surface is processed with electrolytic copper is adhered to the circuit connect 41 using an interlayer adhesive 61. A plating interface 70 of the compression part 60 (hereafter, referring to a second plating interface) for bending the circuit connector 41 is provided on the FPCB 40 at one end of the compression part 60.

The compression part 60 adheres a metal plate 63 made of electrolytic copper under the base film 41a and on the protection film 41d by an interlayer adhesive 61.

However, in an FPCB 60 of a conventional portable terminal, a plating interface inside (hereafter, referring to a first plating interface) a compression part of a circuit connector 41 and a second plating interface 70 of the compression part 60 is respectively provided in the form of a straight as illustrated in FIGS. 3 through 9. As a result, when a circuit connector 41 of the FPCB 40 is assembled with a circuit board connector 50, a force can be applied to the weak first plating interface, instead of the compression part 60. At this time, the first plating interface may be damaged when being folded, causing degradation in a process of assembling the FPCB.

To solve the problem, shield tape or shield foam is additionally adhered to the interface between the compression part 60 and the first plating interface, thereby preventing damage. However, the additional process of adhering the shield tape or shield foam increases time, and the additional use of the shield tape or shield foam increases manufacturing cost.

Moreover, stress concentration occurs at the compression part 60 of the circuit connector 41 and the first plating interface due to sliding after the circuit board connector 50 and the circuit connector 41 of the FPCB 40 are engaged. As a result, repetitive sliding causes intensive rotation or folding and thus cracks at the compression part 60 of the circuit connector 41 and the first plating interface form.

SUMMARY OF THE INVENTION

Therefore, an object of the present invention is to provide a flexible printed circuit board (FPCB) for electronic equipment, in which a second plating interface 70, instead of a first plating interface inside a compression part of the FPCB, is folded by a force generated when a connector of the FPCB is engaged, thereby preventing circuit damage, improving an assembly process, and reducing a product failure rate.

Another object of the present invention is to provide a flexible printed circuit board (FPCB) for electronic equipment, in which a folding part is folded by a force generated when a connector of the FPCB is engaged, thereby reducing product manufacturing cost through no need for a separate damage prevention member in the FPCB.

To achieve the above and other objects, a flexible printed circuit board (FPCB) is provided. The FPCB comprises a circuit connector connected to a circuit board connector of a printed circuit board (PCB) for electronic equipment. A first compression part and a second compression part are included in the circuit connector, and a folding part is provided at a plating interface between the first compression part and the second compression part such that the second plating interface 70, instead of a plating interface of the first compression part and the second compression part, is folded by a force generated when the circuit connector is connected to the circuit board connector.

BRIEF DESCRIPTION OF THE DRAWINGS

The above and other objects, features and advantages of the present invention will become more apparent from the following detailed description when taken in conjunction with the accompanying drawings in which.

Throughout the drawings, like reference numerals will be understood to refer to like parts, components and structures.

DETAILED DESCRIPTION OF EXEMPLARY EMBODIMENTS

Exemplary embodiments of the present invention will now be described in detail with reference to the accompanying drawings.

Figure 1:
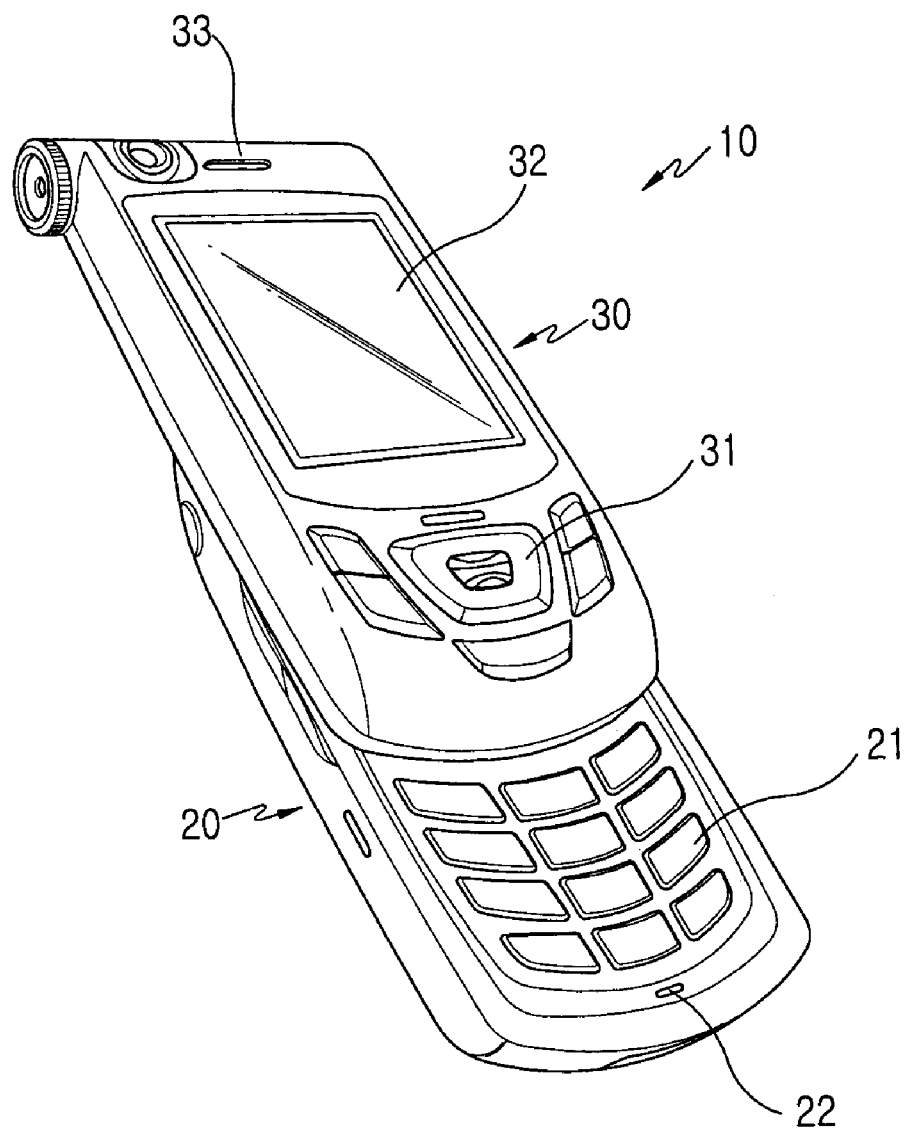
FIG. 1 is a perspective view illustrating a conventional sliding-type portable terminal.
Figure 2:
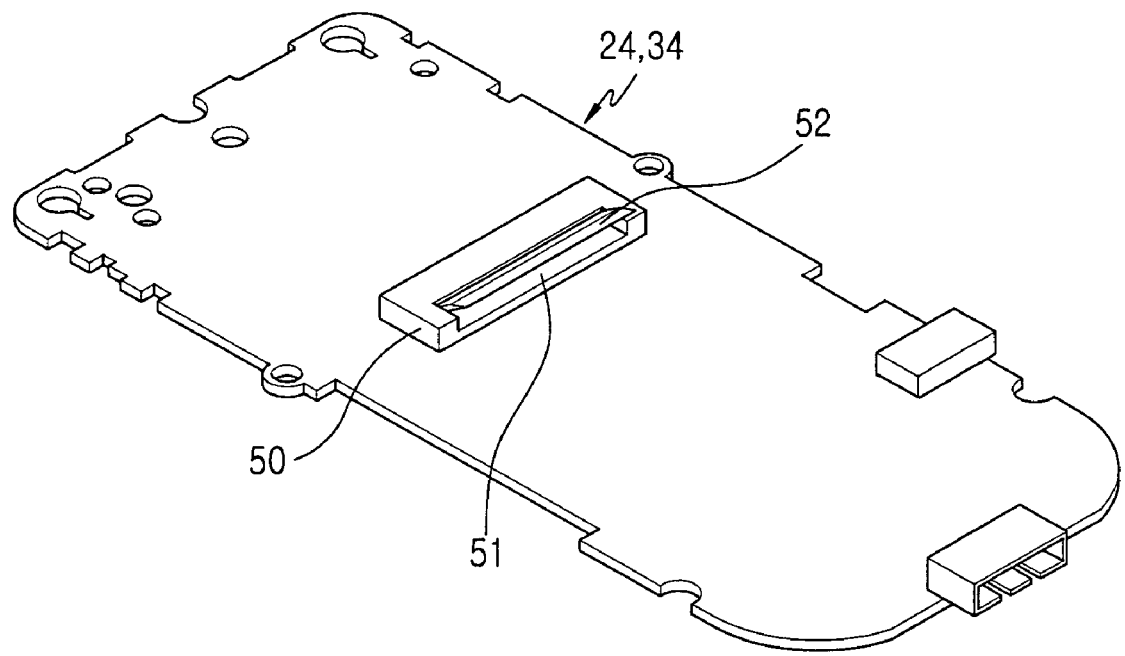
FIG. 2 is a perspective view illustrating a connector included in a printed circuit board (PCB) of the conventional sliding-type portable terminal.
Figure 3:
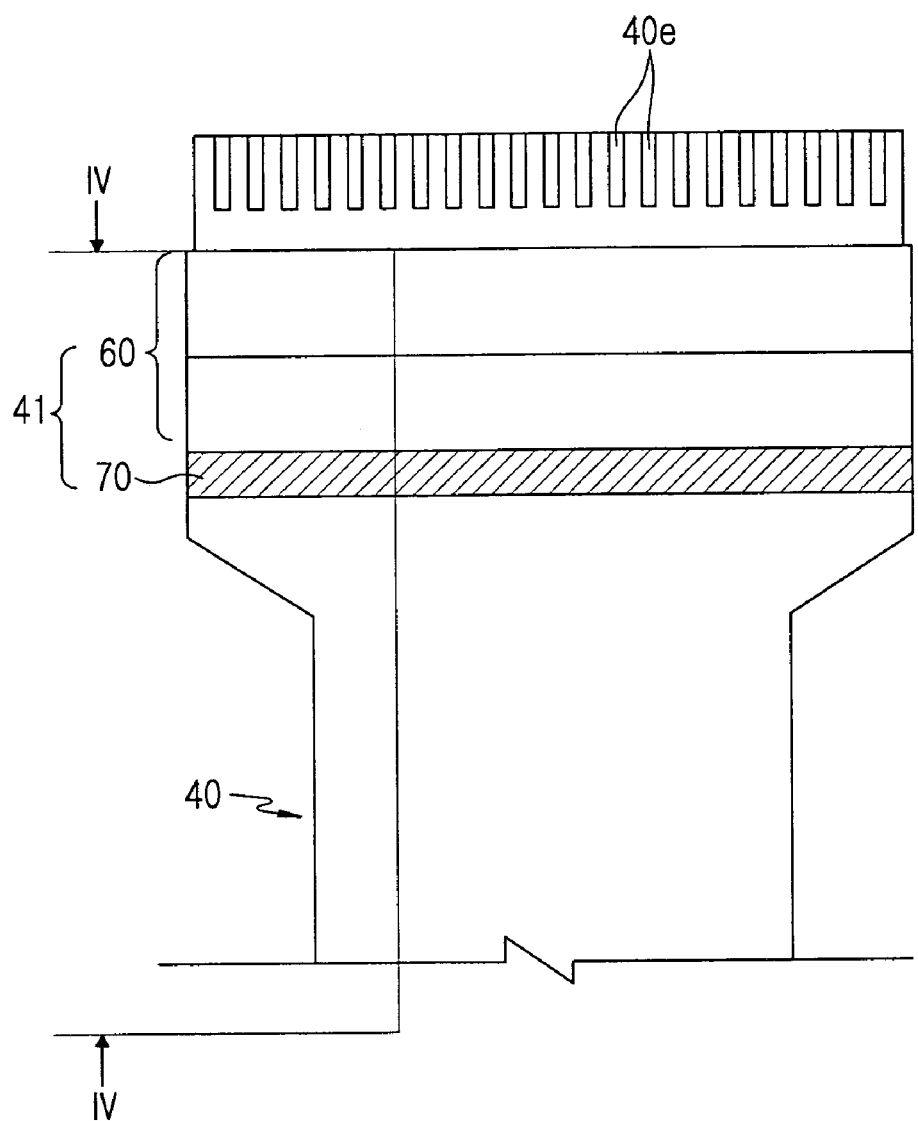
FIG. 3 is a plane view illustrating a circuit connector of a flexible printed circuit board (FPCB) of the conventional sliding-type portable terminal.
Figure 4:
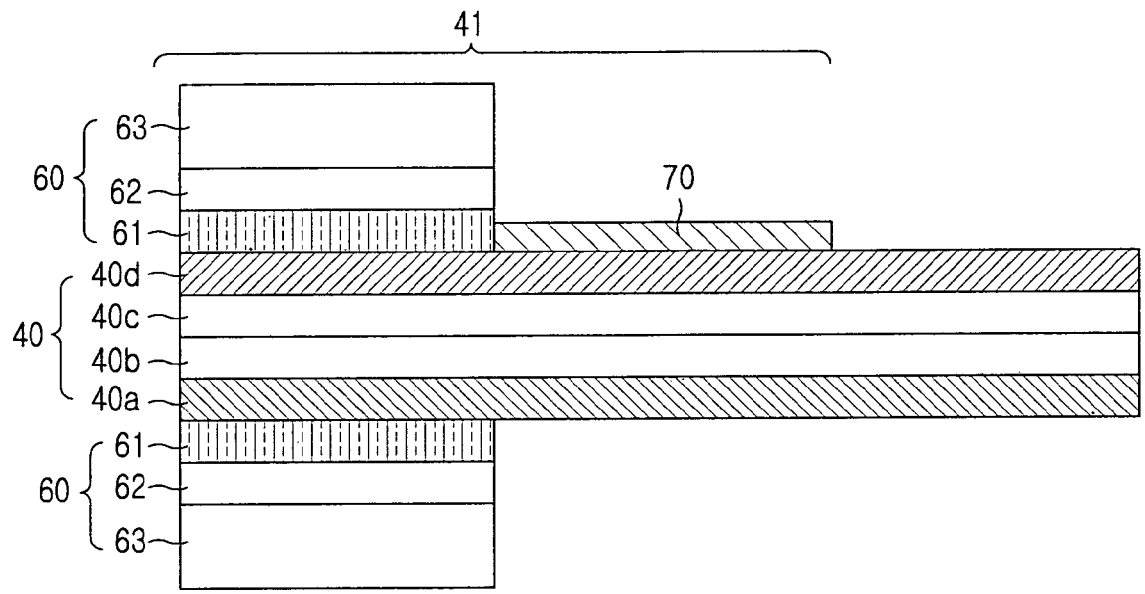
FIG. 4 is a cross-sectional view illustrating a circuit connector of the FPCB of the conventional sliding-type portable terminal.
Figure 5:
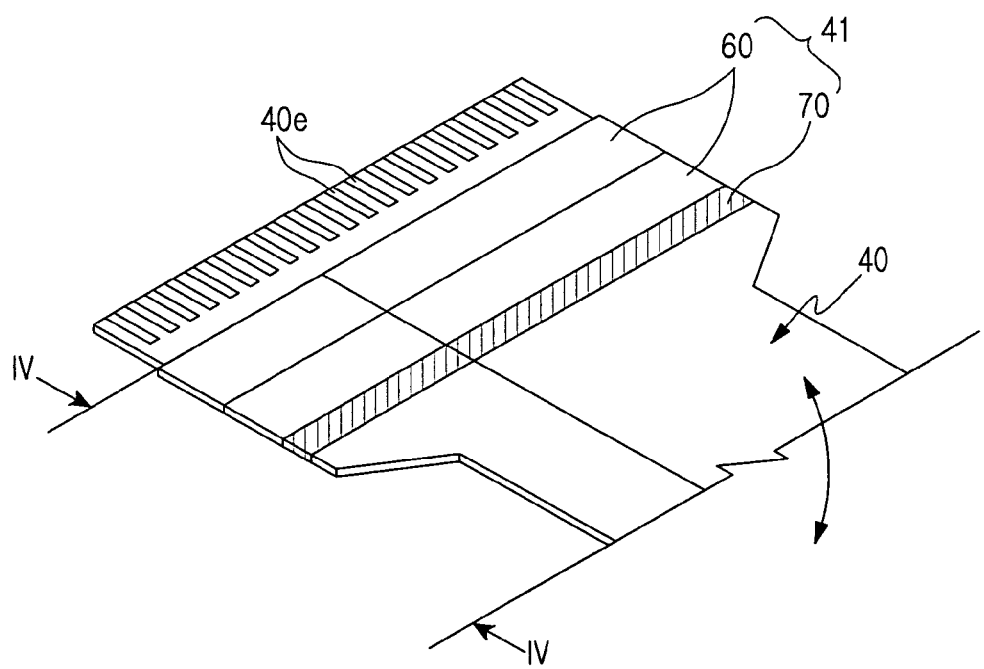
FIG. 5 is a perspective view illustrating conventional engagement of the circuit connector of the FPCB to a circuit board connector.
Figure 6:
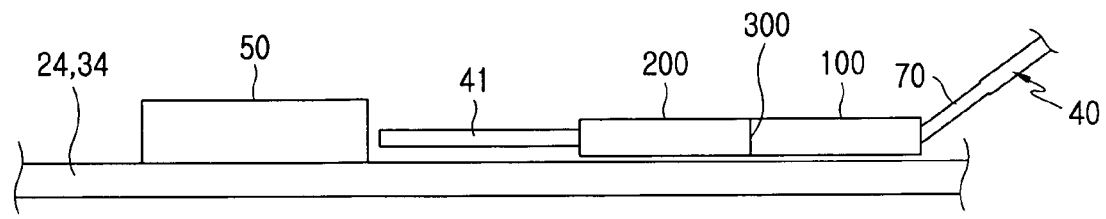
FIG. 6 is a side view illustrating engagement of the circuit connector of the FPCB to the circuit board connector according to an exemplary embodiment of the present invention.

As illustrated in FIG. 6, a circuit board connector 50 is included in a printed circuit board (PCB) 24 and a liquid crystal display (LCD) PCB 34 of electronic equipment 10, and a flexible printed circuit board (FPCB) 40 comprising a circuit connector 41 connected to the circuit board connector 50 is provided.

The FPCB 40 comprises a first compression part 100 and a second compression part 200 whose surfaces are processed electrolytic copper. The first compression part 100 and the second compression part 200 are adhered to the FPCB 40 by an adhesive (not shown). A plating interface 70 (hereafter, referring to a second plating interface) is provided adjacent to the first compression part 100.

As illustrated in FIG. 6, a folding part 300 is provided at a plating interface (hereafter, a first plating interface) between the first compression part 100 and the second compression part 200 such that the second plating interface 70, instead of the first plating interface, is folded by a force generated when the circuit connector 41 is engaged in the circuit board connector 50. The folding part 300 comprises a folding space 301 between the compression parts 100 and 200. The folding part is a flexible part comprising the flexible board 40 and none or one or more layers adhered to this section of the FPCB 40, and is preferably provided in the form of a step.

The first compression part 100 comprises at least one or a plurality of protrusion parts 101 to be corresponding to one or a plurality of insertion parts of the second compression part 200 for bending the FPCB in the folding space 301. The second compression part 200 comprises a plurality of insertion parts 201 into which the protrusion parts 101 correspond to bending the shape of the FPCB in the folding space 301.

The insertion parts 201 are depressed and the protrusion parts 101 are protruded.

The folding space 301 of the folding part 300 is in a zigzag shape, in which one side is protruded and the other side is depressed.

The zigzag shape of the folding space 301 can be made of straight lines or curves.

An operation of the FPCB 40 according to an exemplary embodiment of the present invention will be described in more detail with reference to FIGS. 7 through 9.

Figure 7:
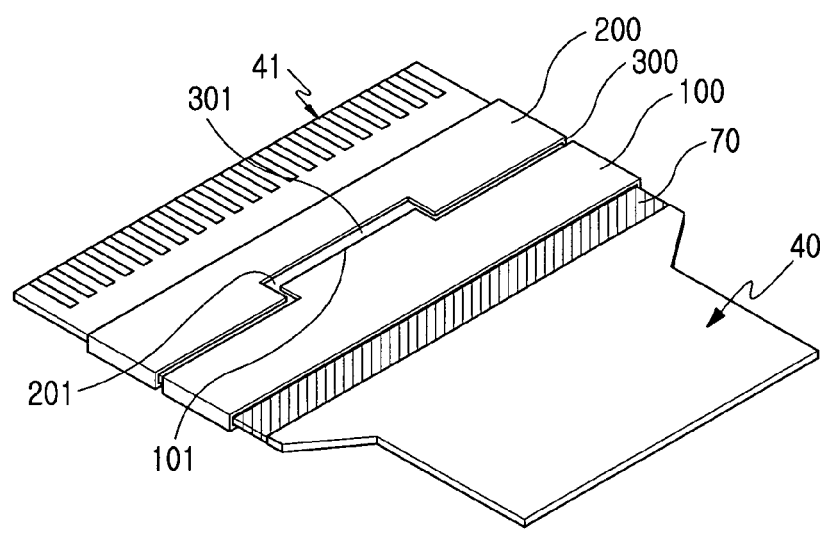
FIG. 7 is a perspective view illustrating combination of components of an FPCB for electronic equipment according to an exemplary embodiment of the present invention.
Figure 8:
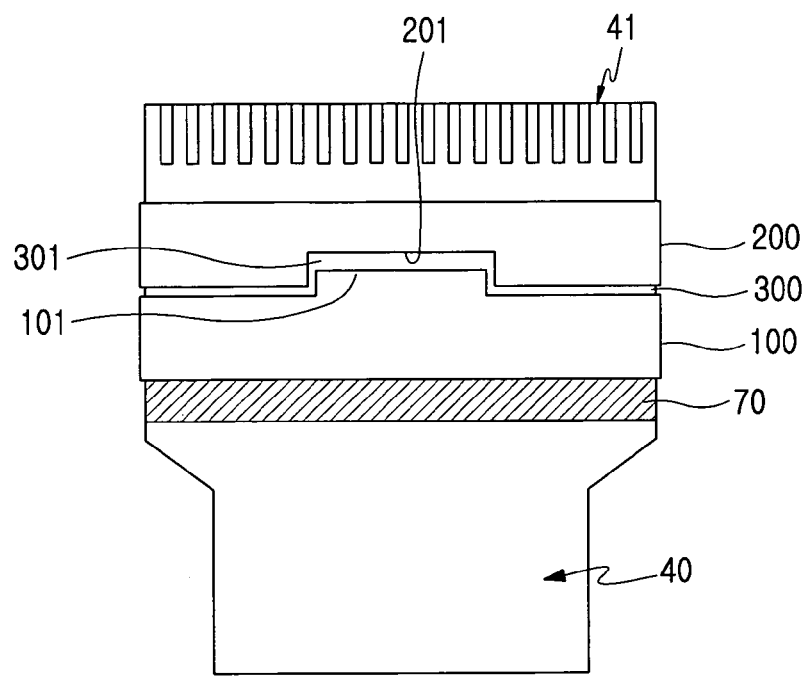
FIG. 8 is a plane view showing combination of components of the FPCB for electronic equipment according to an exemplary embodiment of the present invention.
Figure 9:
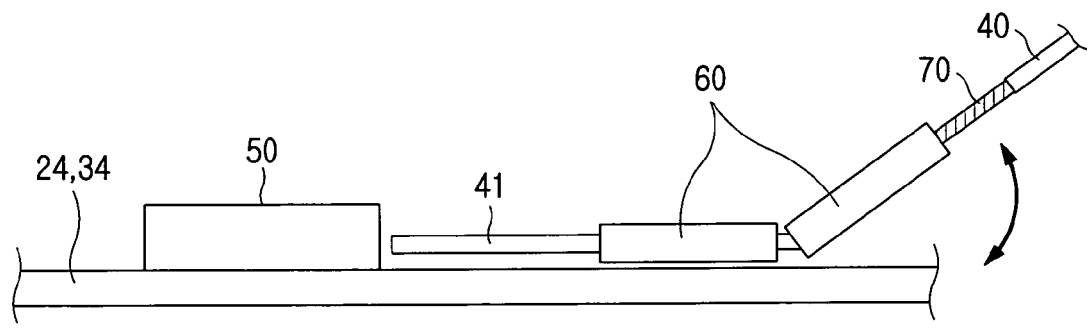
FIG. 9 is a side view showing a conventional use of the FPCB for electronic equipment.

As illustrated in FIGS. 7 and 8, the first compression part 100 and the second compression part 200 are provided at one end of the FPCB 40, and a protrusion part 101 is provided in the first compression part 100.

The second plating interface 70 is provided adjacent to the first compression part 100.

The plurality of insertion part 201 corresponds to the protrusion part 101 provided in the second compression part 200 of the circuit connector 41.

The folding part 300 having the folding space 301 is provided at a first interface between the first compression part 100 and the second compression part 200.

The folding space 301 is preferably in a step shape and is bent in a plurality of directions.

In this state, the circuit connector 41 of the FPCB 40 is engaged in the circuit board connector 50 of the PCB 24 and the LCD PCB 34.

As illustrated in FIG. 6, the second plating interface 70, instead of the first plating interface, is folded by a force generated by the folding space 301 of the folding part 300 in the engagement at the FPCB 40.

At this time, the force generated in the engagement is delivered to the folding space 301 of the folding part 300, instead of the first plating surface, thereby preventing damage to the plating interface 70.

As described above, since an FPCB for electronic equipment provides a folding part comprising a folding space, the second plating interface 70, instead of a first plating interface, is folded by a force generated in engagement of the FPCB, thereby preventing damage to the FPCB caused in engagement, improving an assembly process, and reducing a product failure rate.

While an FPCB for electronic equipment according to an exemplary embodiment of the present invention has been shown and described with reference to a certain preferred embodiment thereof, it will be understood by those skilled in the art that various changes in form and details may be made therein without departing from the spirit and scope of the invention.

For example, the present invention can be applied to all portable terminals.

What is claimed is:

1. A flexible printed circuit board (FPCB) having a circuit connector for connecting to a circuit board connector of a printed circuit board (PCB) for electronic equipment, the circuit connector comprising:

a first compression part disposed on the FPCB adjacent to a second compression part; and a folding part of the FPCB provided at a first plating interface between the first compression part and the second compression part, and a second plating interface provided outside of the first compression part and the second compression part, and where instead of the first plating interface, the folding part is folded by a force generated when the circuit connector is connected to the circuit board connector, and where the first compression part has a protrusion at the first plating interface and the second compression part has a recess receiving the protrusion.

2. The FPCB of claim 1, wherein the second compression part has a folding depression, and the shape of the folding depression is provided in the shape of a step.

3. The FPCB of claim 2, wherein the protrusion is positioned for bending about the folding part with respect to the folding depression.

4. The FPCB of claim 2, wherein the folding part of the FPCB has a zigzag shape defined by the protrusion and the recess.

* * * * *